(12) United States Patent
Haid et al.

(10) Patent No.: US 7,151,682 B2
(45) Date of Patent: Dec. 19, 2006

(54) METHOD AND APPARATUS TO READ INFORMATION FROM A CONTENT ADDRESSABLE MEMORY (CAM) CELL

(75) Inventors: Christopher J. Haid, Folsom, CA (US); Tahmid U. Rahman, Folsom, CA (US); Edward M. Babb, Rescue, CA (US)

(73) Assignee: Intel Corporation, San Jose, CA (US)

( * ) Notice: Subject to any disclaimer, the term of this patent is extended or adjusted under 35 U.S.C. 154(b) by 0 days.

(21) Appl. No.: 11/021,701

(22) Filed: Dec. 22, 2004

(65) Prior Publication Data

US 2006/0133122 A1   Jun. 22, 2006

(51) Int. Cl.
*G11C 15/00* (2006.01)

(52) U.S. Cl. .............. 365/49; 365/189.06; 365/189.07; 365/233

(58) Field of Classification Search .................. 365/45, 365/49, 189.05, 189.09, 189.06, 189.07, 365/233
See application file for complete search history.

(56) References Cited

U.S. PATENT DOCUMENTS

| | | | |
|---|---|---|---|
| 5,267,213 A | 11/1993 | Sung et al. | |
| 5,347,484 A | 9/1994 | Kwong et al. | |
| 5,696,716 A * | 12/1997 | Rolandi | 365/185.21 |
| 6,301,154 B1 * | 10/2001 | Sumitani | 365/185.18 |
| 6,813,174 B1 * | 11/2004 | Srinivasan | 365/49 |
| 7,019,999 B1 * | 3/2006 | Srinivasan et al. | 365/49 |
| 2005/0032478 A1 * | 2/2005 | Stephens et al. | 455/67.11 |

* cited by examiner

*Primary Examiner*—Anh Phung
*Assistant Examiner*—Pho M Luu
(74) *Attorney, Agent, or Firm*—John F. Travis

(57) ABSTRACT

A method and apparatus to read information from a content addressable memory (CAM) cell of a nonvolatile memory is provided. The apparatus may be a nonvolatile memory that may include a first content addressable memory (CAM) cell, wherein the first CAM cell comprises a latch to store volatile binary information and to provide the volatile binary information to an output terminal of the first CAM cell.

17 Claims, 4 Drawing Sheets

METHOD AND APPARATUS TO READ INFORMATION FROM A CONTENT ADDRESSABLE MEMORY (CAM) CELL

BACKGROUND

Nonvolatile memories such as, for example, a flash electrically erasable programmable read-only memory ("flash EEPROM" or "flash memory") may retain their data until the memory is erased. Flash memory may be arranged as blocks of single transistor memory cells that may include a floating gate to store information. Although a flash memory is rewritable, the memory cells may not be re-programmed unless they have first been erased.

Further, the flash memory cells may only be erasable in blocks. Thus in order to erase one cell, an entire block of cells may have to be erased. Erasing a block of flash memory may be a relatively time consuming process. A flash memory may include a content addressable memory (CAM) cell to store configuration information.

Figure 1:
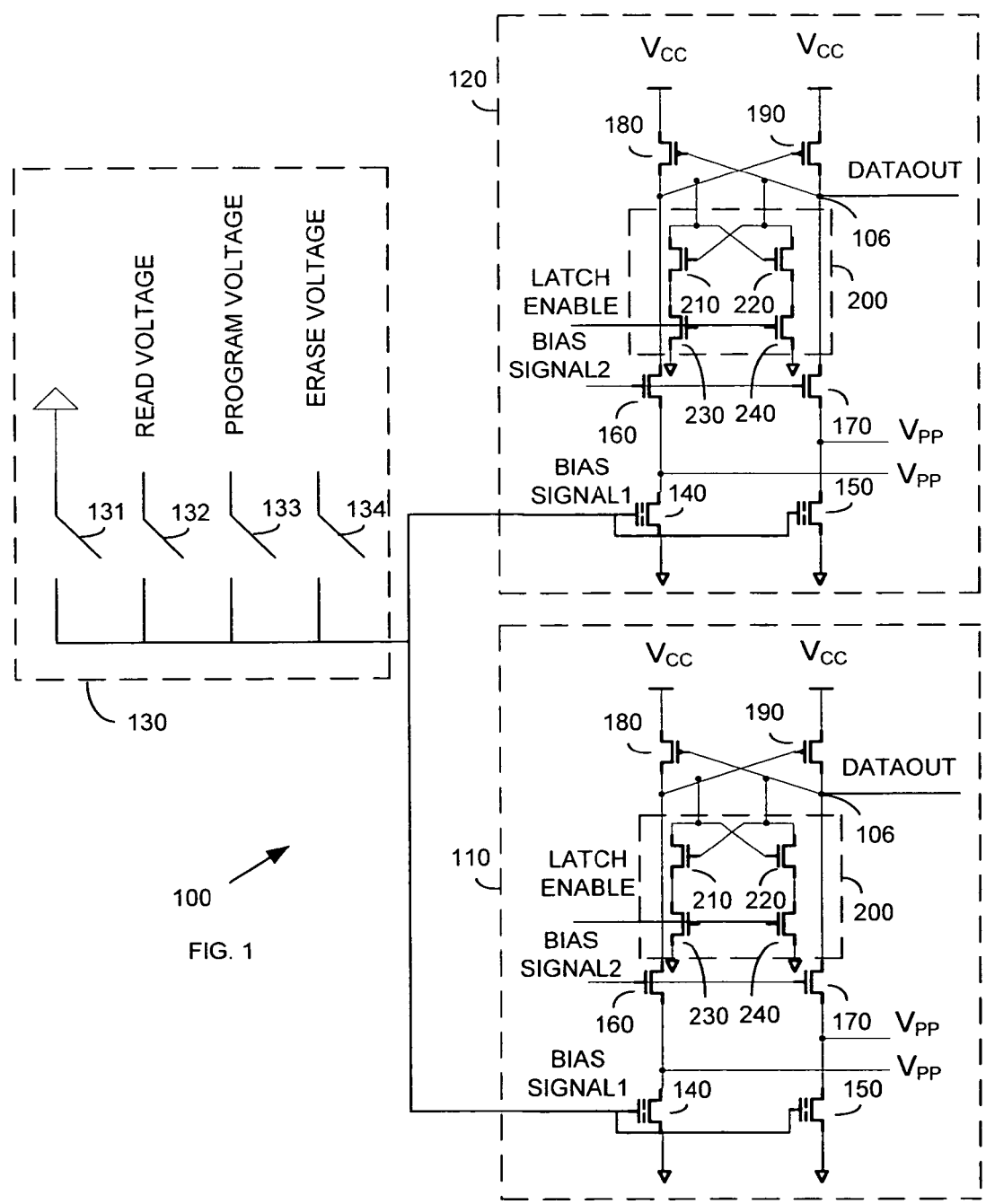
FIG. 1 is a schematic diagram illustrating a portion of a nonvolatile memory in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the present invention. However, it will be understood by those skilled in the art that the present invention may be practiced without these specific details. In other instances, well-known methods, procedures, components and circuits have not been described in detail so as not to obscure the present invention.

In the following description and claims, the term "information" may be used to refer to data, code, or instructions. Further, the terms "include" and "comprise," along with their derivatives, may be used, and are intended to be treated as synonyms for each other. In addition, in the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Further, "coupled" may mean that two or more elements are indirectly joined together, for example, via one or more other elements.

FIG. 1 is a schematic diagram illustrating a portion of a nonvolatile memory 100 in accordance with an embodiment of the present invention. Although the scope of the present invention is not limited in this respect, nonvolatile memory 100 may be used in a personal digital assistant (PDA), a wireless telephone (for example, cordless or cellular phone), a pager, a digital music player, a laptop or desktop computer, a set-top box, a printer, etc.

Although not shown, nonvolatile memory 100 may include a main memory array comprised of one or more blocks of memory, wherein each block includes a plurality of memory cells. In addition, memory 100 may include command decode circuitry to decode commands such as erase, read, or write commands and may include address circuitry to access information stored in the main memory array of nonvolatile memory 100. However, for simplicity these additional components have not been shown.

In an embodiment, nonvolatile memory 100 may be a flash electrically erasable programmable read-only memory (EEPROM) and may include one or more content addressable memory (CAM) cells. For example, nonvolatile memory 100 may include CAM cells 110 and 120. Although two CAM cells are shown in FIG. 1, this is not a limitation of the present invention. In various embodiments, fewer or more than two CAM cells may be used. In one embodiment, nonvolatile memory 100 may include at least several hundred CAM cells.

A CAM cell may be used to store configuration information for nonvolatile memory 100. For example, although the scope of the present invention in not limited in this respect, CAM cell 120 may be used to store 1-bit of configuration information such as, for example, trim settings, array fault locations, whether the nonvolatile memory is a top boot device or a bottom boot device, etc. As noted above, several hundred CAM cells may be included in nonvolatile memory 100 to store configuration information. Although the scope of the present invention is not limited in this respect, information may be read from the CAM cells upon power up or initialization of nonvolatile memory 100. The 1-bit of information stored in CAM cell 120 may be provided at an output terminal 106 of CAM cell 120 and is labeled DATAOUT. In the example wherein CAM cell 120 is used to store one or more bits of configuration information, CAM cell 120 may be referred to as an option CAM.

Although the scope of the present invention is not limited in this respect, CAM cell 110 may be used to store information to implement "on the fly block replacement" or "on the fly block redundancy" in nonvolatile memory 100. This may include nonvolatile memory 100 including one or more redundant or extra blocks of memory (not shown) at the time of manufacture. During operation of nonvolatile memory 100, if a fault is detected in one of the blocks of the main memory array of memory 100, then the physical address of the bad block may be stored using one or more CAM cells and the bad block may be swapped with a redundant block of memory. As an example, eight or nine CAM cells may be used to store the physical address of a bad block. The information stored in CAM cell 110 may be read from CAM cell 110 upon power up or initialization of nonvolatile memory 100. The 1-bit of information stored in CAM cell 110 may be provided at an output terminal 106 of CAM cell 110 and is labeled DATAOUT. In the example wherein CAM cell 110 is used to store one or more bits of a physical address of a bad block for block replacement, CAM cell 110 may be referred to as a redundant block CAM.

CAM cells 110 and 120 may be coupled to a bias circuit 130. Bias circuit 130 may be used to provide a bias signal (labeled BIAS SIGNAL1) to CAM cells 110 and 120. The bias signal may be used to provide a read voltage, a program voltage, or an erase voltage during reading, programming, or erasing of a CAM cell, respectively. In one embodiment, bias circuit 130 may include switches 131, 132, 133, and 134 to provide either ground, a read voltage, a program voltage, or an erase voltage, respectively. In one embodiment, the read voltage may be approximately 4 volts, the program voltage may be approximately 10.5 volts, and the erase voltage may be approximately −8.5 volts.

In an embodiment, CAM cell 110 may include two nonvolatile flash memory cells 140 and 150. Flash memory cells may be N type flash EEPROM transistors, wherein each flash memory cell may have a floating gate underneath a control gate of the flash memory cell. The sources of flash memory cells 140 and 150 may be coupled to ground and the gates of flash memory cells 140 and 150 may be coupled to receive a bias signal labeled BIAS SIGNAL1 from bias circuit 130.

The drains of flash memory cells 140 and 150 may be coupled to receive a programming voltage labeled $V_{PP}$. In one embodiment, $V_{PP}$ may be approximately 10.5 volts. Using the programming voltage, flash memory cells 140 and 150 may be programmed to increase or decrease the charge, for example, electrons, stored on the floating gate of memory cells 140 and 150. Storing charge on a floating gate of a flash memory cell may increase the threshold voltage of a flash memory cell to cause the flash memory cell to be non-conducting when a read voltage is applied to the control gate of the flash memory cell. Removing charge from a floating gate of a flash memory cell, which may be referred to as an "erased state," may decrease the threshold voltage of a flash memory cell to cause the flash memory cell to be conducting when a read voltage is applied to the control gate of the flash memory cell.

CAM cell 110 may also include two N-channel metal-oxide-semiconductor (NMOS) transistors 160 and 170. Transistors 160 and 170 may be referred to as N-channel transistors. The sources of transistors 160 and 170 may be coupled to the drains of flash memory cells 140 and 150, respectively.

In an embodiment, CAM cell 110 may further include two cross-coupled P-channel metal-oxide-semiconductor (PMOS) transistors 180 and 190, wherein the gate of transistor 180 is coupled to the drain of transistor 190 and the gate of transistor 190 is coupled to the drain of transistor 180. The sources of transistors 180 and 190 may be coupled to receive a power supply voltage labeled $V_{CC}$. In one example, $V_{CC}$ may be about 1.8 volts. Transistors 180 and 190 may be referred to as P-channel transistors and may be referred to as pull-up transistors.

Transistors 160 and 170 may be used to isolate the drains of transistors 180 and 190 from memory cell transistors 140 and 150, respectively. Transistors 160 and 170 may also be used to provide a relatively constant drain voltage to memory cells 140 and 150 during read operations of CAM cell 110 to avoid read disturbance problems. Voltages above a specific voltage level at the drains of memory cells 140 and 150 may cause disturbance of the information stored in memory cells 140 and 150.

CAM cell 110 may be said to be programmed to a logical "one" state and provide a relatively high voltage of for example, about 1.8 volts, at output terminal 106. Conversely, CAM cell 110 may be said to be programmed to a logical "zero" state and provide a relatively low voltage of for example, about zero volts, at output terminal 106.

An example of programming nonvolatile memory cells 140 and 150 to provide a voltage representative of a logical "one" at output terminal 106 may include erasing memory cell 140 so that memory cell 140 is "on," i.e., conducting, during application of a read voltage to the gate of memory cell 140, and may include programming memory cell 150 so that memory cell 150 is "off," i.e., non-conducting during application of a read voltage to the gate of memory cell 150. In this example, a read bias voltage of, for example, about 1.33 volts or about 1.5 volts may be may be applied to the gates of transistors 160 and 170 and a read bias voltage of, for example, about 4 volts may be may be applied to the gates of memory cell transistors 140 and 150. The read bias voltages may be provided by bias circuit 130 and may be sufficient to turn "on" transistors 160 and 170. Although not illustrated in FIG. 1, in addition to providing BIAS SIGNAL1, bias circuit 130 may also include circuitry (not shown) to provide the bias signal labeled BIAS SIGNAL2 to the gates of transistors 160 and 170. In alternate embodiments, another bias circuit (not shown) or control circuit (not shown) may be used to provide BIAS SIGNAL2.

Continuing with the same example, after application of the read bias voltages, since transistor 150 is non-conducting, the drain voltage of memory cell 150 may be equal to the BIAS SIGNAL2 voltage minus the threshold voltage of transistor 170. Since memory cell 140 is conducting, the drain voltage of memory cell 140 may be equal to about zero volts since the source of memory cell 140 is coupled to ground. Accordingly, a relatively low voltage of about zero volts is provided to the gate of transistor 190 by conducting transistors 140 and 160. This may result in turning on transistor 190 which may provide a relatively high voltage potential of about $V_{CC}$ to output terminal 106. In addition, turning on transistor 190 will result in providing a voltage potential of about $V_{CC}$ to the gate of transistor 180, thereby turning "off" transistor 180. Accordingly, a relatively high voltage of about $V_{CC}$ may be provided at output terminal 106 since transistors 140, 160, and 190 are "on," i.e., conducting and transistors 150 and 180 are "off," i.e., not conducting.

An example of programming nonvolatile memory cells 140 and 150 to provide a voltage representative of a logical "zero" at output terminal 106 may include erasing memory cell 150 so that memory cell 150 is "on," i.e., conducting, during application of a read voltage to the gate of memory cell 150 and may include programming memory cell 140 so that memory cell 140 is "off," i.e., non-conducting during application of a read voltage to the gate of memory cell 140. This may result in turning transistor 180 "on" since a relatively low voltage of about zero volts will be provided to the gate of transistor 180 by conducting transistors 150 and 170. Further, with transistor 180 on, a relatively high voltage of about Vcc may be provided to the gate of transistor 190 to turn transistor 190 off. This will result in a relatively low voltage of for example, zero volts, at output terminal 106 since transistors 150, 170, and 180 are "on," i.e., conducting and transistors 140 and 190 are "off," i.e., not conducting.

Since memory cells 140 and 150 are nonvolatile memory cells, the information stored in these memory cells is nonvolatile so that the information is preserved even when power is removed from nonvolatile memory 100. As may be appreciated, the logical state of CAM cell 110 may be generated using the information stored in nonvolatile memory cells 140 and 150 when power is provided to CAM cell 110.

In an embodiment, CAM cell 110 may also include a latch 200. Latch 200 may be a bistable multivibrator circuit and may include four N-channel transistors 210, 220, 230, and 240. Transistors 210 and 220 may be cross-coupled wherein the gate of transistor 210 is coupled to the drain of transistor 220 and the gate of transistor 220 is coupled to the drain of transistor 210. The gates of transistors 230 and 240 are coupled to receive a bias signal labeled LATCH ENABLE. The sources of transistors 230 and 240 are coupled to ground. The drain of transistor 230 is coupled to the source of transistor 210 and the drain of transistor 240 is coupled to the source of transistor 220.

In an embodiment, latch 200 may store one bit of volatile binary information and provide the volatile binary information to output terminal 106 of the CAM cell 110. For example, latch 200 may serve as a volatile latch to store the logical state of CAM cell 110 while power, for example, $V_{CC}$, is applied to CAM cell 110. Accordingly, the information provided at output terminal 106 of CAM cell 110 may be latched upon power up of nonvolatile memory 110 using latch 200. In this example, after information is read form the nonvolatile memory cells 140 and 150 and the logical state, that is, DATAOUT, is latched using latch 200, then the bias signals applied to transistors 160 and 170 and memory cells 140 and 150 may be removed to disconnect or isolate memory cells 140 and 150.

After DATAOUT is latched in latch 200, then latch 200 may maintain the logical state of DATAOUT. Thus, the nonvolatile memory cells 140 and 150 only need to be biased to transfer information to latch 200 and during programming, erasing, and reading of these memory cells. By not continually applying bias signals to the gates of nonvolatile memory cells 140 and 150 during the operation of nonvolatile memory 100, this may reduce the stress (for example, High Temperature Reverse Bias) on nonvolatile memory cells 140 and 150. Further, by not continually applying bias signals to the gates of transistors 140, 150, 160, and 170, this may reduce the steady state power draw that may be used to maintain DATAOUT during operation of nonvolatile memory 100.

As an example, if memory cell 140 is erased and memory cell 150 is programmed, then as discussed above, the logical state of CAM cell 110 is a logical "one," wherein a relatively high voltage of about $V_{CC}$ is provided at output terminal 106 when read voltages are applied to the gates of transistors 140, 150, 160, and 170.

Latch 200 may be enabled by providing a positive voltage potential greater than the threshold voltage of transistors 230 and 240 to the gates of transistors 230 and 240 to turn "on" transistors 230 and 240. Continuing with the example wherein memory cell 140 is erased and memory cell 150 is programmed, the relatively high voltage at output terminal 106 is applied to the gate of transistor 210, which turns "on" transistor 210 to apply about zero volts to the gate of transistor 220, thereby turning "off" transistor 220. Accordingly, after the DATAOUT information is latched in latch 200, then latch 200 may maintain the relatively high voltage of about $V_{CC}$ at output terminal 106 independent of nonvolatile memory cells 140 and 150. Accordingly, the bias signals applied to the gates of transistors 140, 150, 160, and 170 may be removed to reduce power consumption and stress on memory cells 140 and 150.

In an embodiment, similar to CAM cell 120, CAM cell 120 may include nonvolatile flash memory cells 140 and 150, N-channel transistors 160 and 170, and P-channel transistors 180 and 190. In addition, CAM cell 120 may include a latch 200 that may include N-channel transistors 210, 220, 230, and 240.

Figure 2:
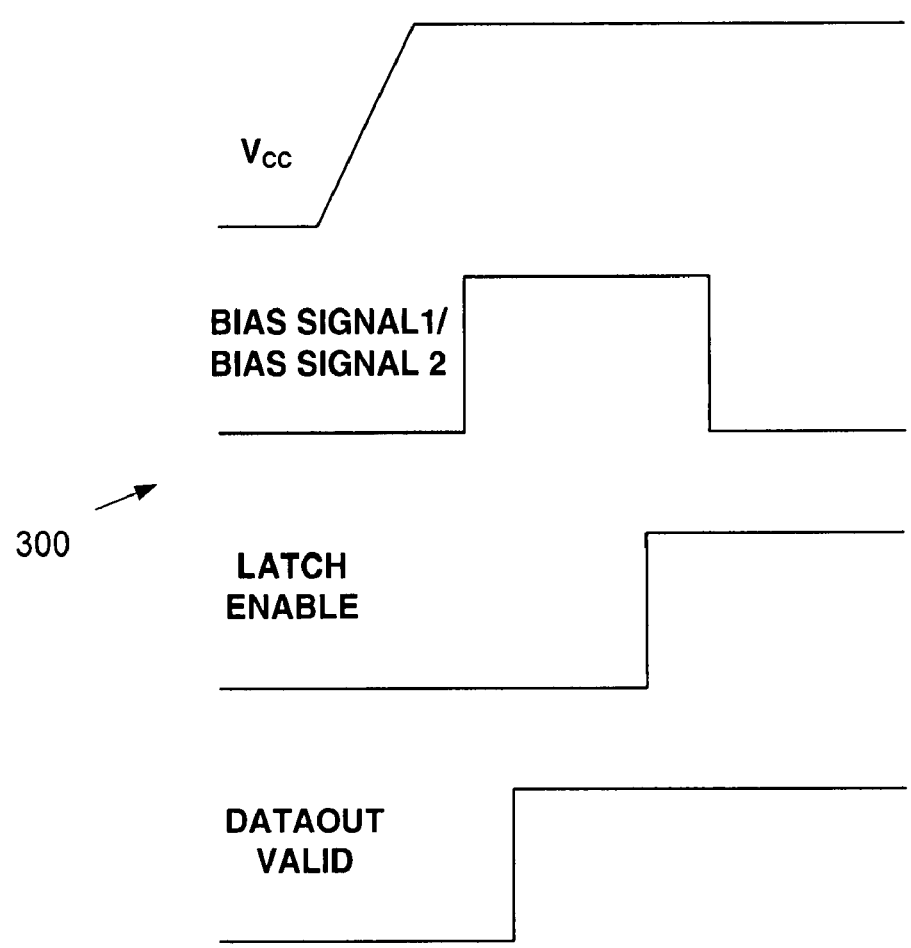
FIG. 2 is a timing diagram illustrating a sequence for power up of a content addressable memory (CAM) cell in accordance with an embodiment of the present invention.

Turning to FIG. 2, a timing diagram 300 is shown illustrating a sequence for power up of CAM cell 110 in accordance with an embodiment of the present invention. As may be appreciated, timing diagram 300 may also be used to illustrate a sequence for power up of CAM cell 120. Although the scope of the present invention is not limited in this respect, in an embodiment, reading and latching DATAOUT of CAM cell 110 may be a two step process.

First, read voltages may be applied to the gates of transistors 140, 150, 160, and 170. In other words, BIAS SIGNAL1 and BIAS SIGNAL2 may be enabled to provide a positive voltage to the gates of transistors 140, 150, 160, and 170. This may allow the DATAOUT signal at output terminal 106 to either be pulled low (if the flash memory cell 150 is erased and flash memory cell 140 is programmed) or pulled high (if the flash memory cell 150 is programmed and flash memory cell 140 is erased). Second, to transfer the data to latch 200, LATCH ENABLE is enabled prior to disabling or removing BIAS SIGNAL1 and BIAS SIGNAL2.

Although the scope of the present invention is not limited in this respect, in an embodiment, the only time when the data needs to be passed to latch 200 for storing in latch 200 is during the power up of nonvolatile memory 100 and immediately after new data is programmed into one of the flash memory cells 140 or 150. In FIG. 2, power up or initialization is illustrated by the transition of $V_{CC}$ from a relatively low voltage level to a relatively high voltage level. As is illustrated in FIG. 2, during power up, both BIAS SIGNAL1 and BIAS SIGNAL2 are enabled for sufficient time for CAM cell 110 to stabilize, that is, to allow DATAOUT to be valid. Then the LATCH ENABLE signal is enabled prior to disabling or removing BIAS SIGNAL1 and BIAS SIGNAL2 to transfer DATAOUT to latch 200. Removing BIAS SIGNAL1 and BIAS SIGNAL2 may reduce the power consumption of CAM cells 110 and 120.

After power up, in the event that new data is programmed into one of the CAM cells of nonvolatile memory 100, all other CAM cells other than the one being programmed may still provide valid data at their output terminal using a latch such as, for example, latch 200. For example, in the event that new data is programmed into one of the flash memory cells of CAM cell 110, then valid data may still be provided at the output terminal of other CAM cells of nonvolatile memory 100. In other words, valid information may be read from CAM cell 120 at output terminal 106 of CAM cell 120 simultaneously while programming/writing or erasing either memory cell 140 or memory cell 150 of CAM cell 110.

Since a single switch may be used to provide programming voltages to memory cells 140 and 150 of CAM cells 110 and 120, when programming memory cells 140 and 150 of CAM cell 110, the same program voltage is applied to the gates of memory cells 140 and 150 of CAM cell 120. As discussed above, latch 200 provides the ability to maintain the value of DATAOUT while disconnecting or isolating memory cells 140 and 150 from output terminal 106. This provides the ability to provide simultaneously read while programming different CAM cells of nonvolatile memory 100. Although the scope of the present invention is not limited in this respect, in an embodiment, once the new data is programmed into a selected CAM cell, the data is passed into latch 200 of the CAM cell by following the sequence illustrated in FIG. 3.

Figure 3:
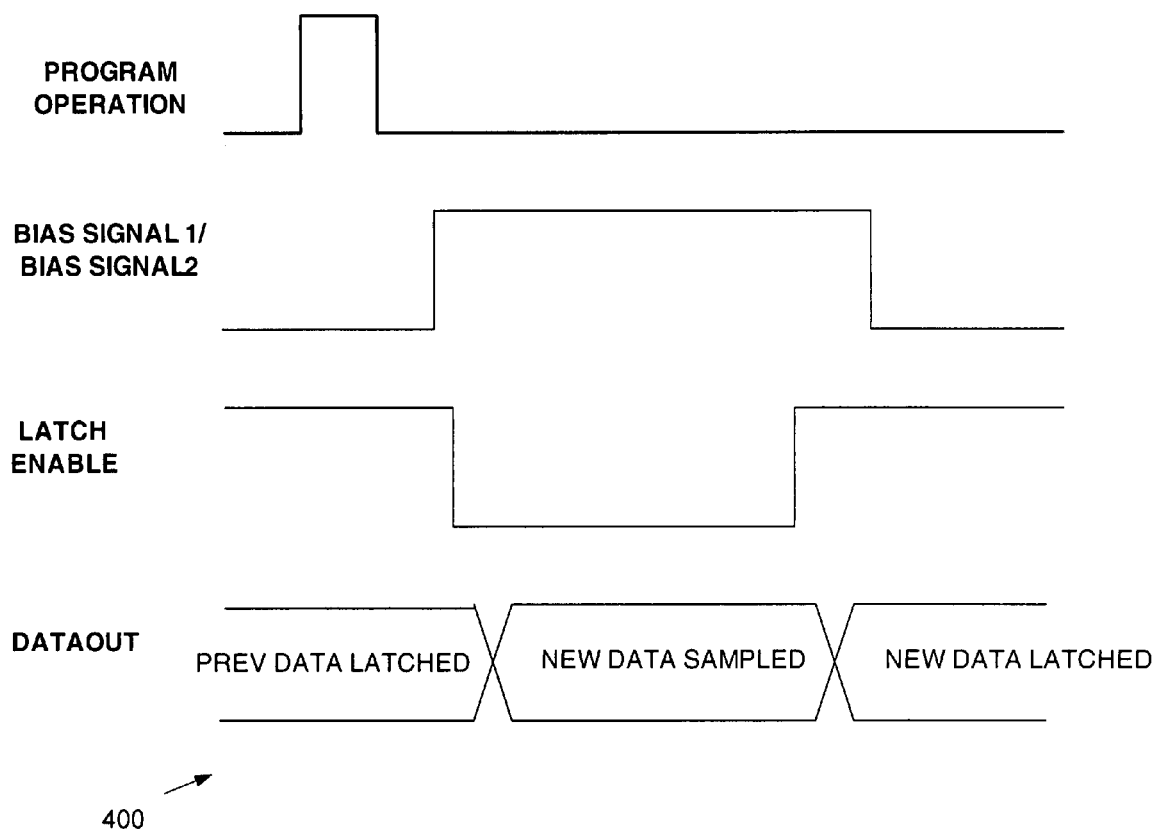
FIG. 3 is a timing diagram illustrating latching of new data into a latch after programming new data into a content addressable memory (CAM) cell in accordance with an embodiment of the present invention.

Turning to FIG. 3, a timing diagram 400 is shown illustrating latching of new data into latch 200 after programming new information into a nonvolatile memory cell of CAM cell 110 in accordance with an embodiment of the present invention. The signal in timing diagram 400 labeled PROGRAM OPERATION illustrates the event of writing to, or programming a nonvolatile memory cell, e.g., memory cell 140 or 150, of CAM cell 110. As is illustrated in FIG. 3, after the program operation, BIAS SIGNAL1 and BIAS SIGNAL2 are enabled to provide DATAOUT, then LATCH ENABLE is disabled to sample the new state of DATAOUT. Next, LATCH ENABLE is enabled prior to disabling BIAS SIGNAL1 and BIAS SIGNAL2 to transfer DATAOUT to latch 200.

If during power up CAM cells are latched using for example, a latch such as latch 200, then BIAS SIGNAL1 and BIAS SIGNAL2 may not be needed during active mode. The flash cell may stay disconnected for a major portion of a chip's functional time. This may reduce the stress on a flash memory cell. The methods and circuits discussed above may also enable the DATAOUT to be valid while accessing other CAM cells for programming or verify.

With higher memory density there may be a use for more on-chip redundant memory blocks and bad block address CAMs associated with each of them. Each set of bad block address CAMs may use a set of high voltage switches to supply voltage during different modes of access in order to keep the un-accessed CAMs undisturbed. If the CAMs are latched using for example, a latch similar to latch 200, then all CAMs may share one high voltage switch. Thus during access of any CAM, the rest of the CAMs may be read out too.

Using the embodiments of the methods and apparatuses discussed above, a flash memory may have different types of CAMs which may be programmed and read simultaneously without increasing high voltage switching circuitry. A need for programming CAMs on a customer system may arise from a need to do in situ self repair. This may include storing the bad memory block addresses in a set of CAMs. With larger die sizes, the number of this kind of repair may increase. In addition, users of flash memory may desire some un-programmed CAMs available for storing their configurations. This feature implementation may be realized using a group of CAMs that are able to be programmed and read simultaneously, such as the CAMs discussed above in the various embodiments.

Since the bias voltages may be turned "off" from the gate of a flash cell during active mode of a CAM cell, the embodiments of the methods and apparatuses discussed above may also contribute to mitigating voltage stress impact on flash cell Vt, a phenomenon known as HTRB (High Temperature Reverse Bias).

Using the embodiments of the methods and apparatuses discussed above, high voltage bias circuits may be shared among all memory blocks because it is possible to both read and write to the CAMs at the same time. Also with this feature, CAMs may leave the factory unprogrammed without that much power consumption concern since they may be latched and the flash cells may be disconnected.

Figure 4:
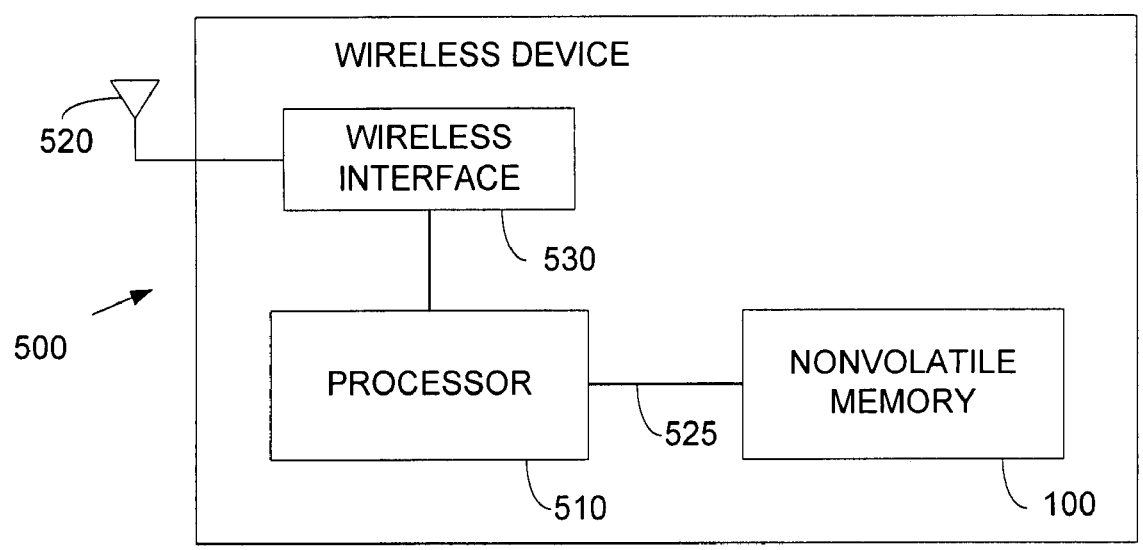
FIG. 4 is a block diagram illustrating a wireless device in accordance with an embodiment of the present invention.

Turning to FIG. 4, shown is a block diagram illustrating a wireless device 500 in accordance with an embodiment of the present invention. In one embodiment, wireless device 500 may use the methods discussed above and may include nonvolatile memory 100 (FIG. 1) coupled to a processor 510 via a bus 525. Bus 525 may include one or more busses and may be a single 16-bit bus in one embodiment. Although not shown, wireless device 100 may include other components such as, for example, more processors, input/output (I/O) devices, memory devices, or storage devices. However, for simplicity these additional components have not been shown.

In an embodiment, processor 510 may be a discrete component or device and may be external to nonvolatile memory 100 and in another embodiment processor 510 and memory 100 may be integrated together on a single semiconductor die. Processor 510 may include digital logic to execute software instructions and may also be referred to as a central processing unit (CPU). Software instructions executed by processor 510 may be stored in nonvolatile memory 100 and may also be referred to as code. Although the scope of the present invention is not limited in this respect, processor 510 may be a 4-bit, 8-bit, 16-bit, 32-bit, or 64-bit microprocessor.

As is shown in FIG. 4, wireless device 500 may further include an antenna 520 coupled to a processor 510 via a wireless interface 530. In various embodiments, antenna 520 may be a dipole antenna, helical antenna or another antenna adapted to wirelessly communicate information. Wireless interface 530 may be adapted to process radio frequency (RF) and baseband signals using wireless protocols and may include baseband circuitry and/or a wireless transceiver.

Wireless device 500 may be a personal digital assistant (PDA), a laptop or portable computer with wireless capability, a web tablet, a wireless telephone (for example, cordless or cellular phone), a pager, an instant messaging device, a digital music player, a digital camera, or other devices that may be adapted to transmit and/or receive information wirelessly. Wireless device 500 may be used in any of the following systems: a wireless personal area network (WPAN) system, a wireless local area network (WLAN) system, a wireless metropolitan area network (WMAN) system, or a wireless wide area network (WWAN) system such as, for example, a cellular system.

An example of a WLAN system includes a system substantially based on an Industrial Electrical and Electronics Engineers (IEEE) 802.11 standard. An example of a WMAN system includes a system substantially based on an Industrial Electrical and Electronics Engineers (IEEE) 802.16 standard. An example of a WPAN system includes a system substantially based on the Bluetooth™ standard (Bluetooth is a registered trademark of the Bluetooth Special Interest Group). Another example of a WPAN system includes a system substantially based on an Industrial Electrical and Electronics Engineers (IEEE) 802.15 standard such as, for example, the IEEE 802.15.3a specification using ultrawideband (UWB) technology.

Examples of cellular systems include: Code Division Multiple Access (CDMA) cellular radiotelephone communication systems, Global System for Mobile Communications (GSM) cellular radiotelephone systems, Enhanced data for GSM Evolution (EDGE) systems, North American Digital Cellular (NADC) cellular radiotelephone systems, Time Division Multiple Access (TDMA) systems, Extended-TDMA (E-TDMA) cellular radiotelephone systems, GPRS, third generation (3G) systems like Wide-band CDMA (WCDMA), CDMA-2000, Universal Mobile Telecommunications System (UMTS), or the like.

Although nonvolatile memory 100 is illustrated as being used in a wireless device in one embodiment, this is not a limitation of the present invention. In alternate embodiments nonvolatile memory 100 may be used in non-wireless devices such as, for example, a server, a desktop, or an embedded device not adapted to wirelessly communicate information.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A nonvolatile memory, comprising
a first content addressable memory (CAM) cell, wherein the first CAM cell comprises a latch to store volatile binary information and to provide the volatile binary information to an output terminal of the first CAM cell, wherein the first CAM cell further comprises:
a first nonvolatile memory cell having a floating gate, a control gate, a drain, and a source coupled to ground;
a second nonvolatile memory cell having a floating gate, a control gate coupled to the control gate of the first nonvolatile memory cell, a drain, and a source coupled to ground;
a first transistor having a gate, a source coupled to the drain of the first nonvolatile memory cell, and a source; and
a second transistor having a gate coupled to the gate of the first transistor, a source coupled to the drain of the second nonvolatile memory cell, and a source;
a third transistor having a gate, a drain coupled to a drain of the first transistor, and a source coupled to receive a voltage potential; and
a fourth transistor having a gate coupled to the drain of the third transistor, a drain coupled to coupled to the gate of the third transistor, and a source coupled to receive the voltage potential, wherein the drain of the fourth transistor is coupled to the output terminal of the first CAM cell.

2. The nonvolatile memory of claim 1, wherein the nonvolatile memory is a flash electrically erasable programmable read-only memory (EEPROM).

3. The nonvolatile memory of claim 1, wherein the latch is a bistable multivibrator circuit.

4. The nonvolatile memory of claim 1, wherein the first nonvolatile memory cell is a flash memory cell transistor, the second nonvolatile memory cell is a flash memory cell transistor, the first transistor is an N-channel transistor, the second transistor is an N-channel transistor, the third transistor is a P-channel transistor, and the fourth transistor is a P-channel transistor.

5. The nonvolatile memory of claim 1, wherein the latch comprises:
a fifth transistor having a gate coupled to the drain of the fourth transistor, a source coupled to the drain of the third transistor, and a drain;
a sixth transistor having a gate coupled to the drain of the third transistor, a source coupled to the drain of the fourth transistor, and a drain;
a seventh transistor having a gate, a source coupled to ground, and a drain coupled to the drain of the fifth transistor, and
an eighth transistor having a gate coupled to the gate of the seventh transistor, a source coupled to ground, and a drain coupled to the drain of the sixth transistor.

6. The nonvolatile memory of claim 5, wherein the fifth, sixth, seventh, and eighth transistors are N-channel transistors.

7. The nonvolatile memory of claim 1, further comprising:
a bias circuit to provide a bias signal to the control gate of the first nonvolatile memory cell and provide the bias signal to the control gate of the second nonvolatile memory cell, wherein the bias signal is used to provide a read voltage, a program voltage, or an erase voltage during reading, programming, or erasing of the first CAM cell, respectively.

8. The nonvolatile memory of claim 7, further comprising a second CAM cell, wherein the second CAM cell comprises:
a second latch to store volatile configuration information and provide the volatile configuration information to an output terminal of the second CAM cell and wherein the volatile binary information in the latch of the first CAM cell is one bit of the physical address of a bad memory block of the nonvolatile memory;
a third nonvolatile memory cell having a floating gate, a control gate coupled to receive the bias signal, a drain, and a source coupled to ground;
a fourth nonvolatile memory cell having a floating gate, a control gate coupled to the control gate of the third nonvolatile memory cell, a drain, and a source coupled to ground;
a fifth transistor having a gate, a source coupled to the drain of the third nonvolatile memory cell, and a source; and
a sixth transistor having a gate coupled to the gate of the fifth transistor, a source coupled to the drain of the fourth nonvolatile memory cell, and a source;
a seventh transistor having a gate, a drain coupled to a drain of the fifth transistor, and a source coupled to receive a voltage potential; and
an eight transistor having a gate coupled to the drain of the seventh transistor, a drain coupled to coupled to the gate of the seventh transistor, and a source coupled to receive the voltage potential, wherein the drain of the eighth transistor is coupled to the output terminal of the first CAM cell.

9. The nonvolatile memory of claim 8, wherein the bias circuit includes a switch coupled to the control game of the first nonvolatile memory cell of the first CAM cell, the control gate of the second nonvolatile memory cell of the first CAM cell, the control gate of the third nonvolatile memory cell of the second CAM cell, and the control gate of the fourth nonvolatile memory cell of the second CAM cell.

10. The nonvolatile memory of claim 8, wherein the second latch of the second CAM cell comprises:
a ninth transistor having a gate coupled to the drain of the eighth transistor, a source coupled to the drain of the seventh transistor, and a drain;
a tenth transistor having a gate coupled to the drain of the seventh transistor, a source coupled to the drain of the eighth transistor, and a drain;
a eleventh transistor having a gate, a source coupled to ground, and a drain coupled to the drain of the ninth transistor; and
a twelfth transistor having a gate coupled to the gate of the eleventh transistor, a source coupled to ground, and a drain coupled to the drain of the tenth transistor.

11. The nonvolatile memory of claim 10, wherein the third nonvolatile memory cell is a flash memory cell transistor, the fourth nonvolatile memory cell is a flash memory cell transistor, the seventh and eighth transistors are P-channel transistors, and the fifth, sixth, ninth, tenth, eleventh, and twelfth transistors are N-channel transistors.

12. A method, comprising:
reading information from a first CAM cell of a plurality of CAM cells of a nonvolatile memory while simultaneously programming a second CAM cell of the plurality of CAM cells, wherein the first CAM cell comprises a latch to store volatile binary information and to provide the volatile binary information to an output terminal of the CAM cell;
providing a bias signal to the first CAM cell and the second CAM cell after power up of the nonvolatile memory;
providing a latch enable signal to the latch of the first CAM cell prior to removing the bias signal; and
removing the bias signal to reduce power consumption of the first CAM cell and the second CAM cell.

13. The method of claim 12, wherein providing the latch enable signal includes providing the latch enable signal to a latch of the second CAM cell prior to removing the bias signal.

14. The method of claim 12, wherein providing the bias signal includes using a switch to provide a positive voltage to the first CAM cell and the second CAM cell.

15. A system, comprising:
a processor;
an antenna coupled to the processor; and
a nonvolatile flash electrically erasable programmable read-only memory (EEPROM) coupled to the processor, comprising a first content addressable memory (CAM) cell, wherein the first CAM cell comprises a latch to store volatile binary information and to provide the volatile binary information to an output terminal of the first CAM cell;
wherein the first CAM cell further comprises
a first nonvolatile memory cell having a floating gate, a control gate, a drain, and a source coupled to ground;
a second nonvolatile memory cell having a floating gate, a control gate coupled to the control gate of the first nonvolatile memory cell, a drain, and a source coupled to ground;
a first transistor having a gate, a source coupled to the drain of the first nonvolatile memory cell, and a source;
a second transistor having a gate coupled to the gate of the first transistor, a source coupled to the drain of the second nonvolatile memory cell, and a source;
a third transistor having a gate, a drain coupled to a drain of the first transistor, and a source coupled to receive a voltage potential; and
a fourth transistor having a gate coupled to the drain of the third transistor, a drain coupled to coupled to the gate of the third transistor, and a source coupled to receive the voltage potential, wherein the drain of the fourth transistor is coupled to the output terminal of the first CAM cell.

16. The system of claim 15, wherein the system is a wireless phone.

17. The nonvolatile memory of claim 15, wherein the latch is a bistable multivibrator circuit.

* * * * *